US008502960B2

(12) United States Patent
Brinkhof et al.

(10) Patent No.: US 8,502,960 B2
(45) Date of Patent: Aug. 6, 2013

(54) HEAT TRANSFER ASSEMBLY, LITHOGRAPHIC APPARATUS AND MANUFACTURING METHOD

(75) Inventors: Eugene Maria Brinkhof, Weert (NL); Joannes Hendricus Maria Van Oers, Valkenswaard (NL); Robertus Adolphus Maria Kuipers, Helmond (NL); Vasco Francisco Bovée, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 413 days.

(21) Appl. No.: 12/834,768

(22) Filed: Jul. 12, 2010

(65) Prior Publication Data

US 2011/0007288 A1 Jan. 13, 2011

Related U.S. Application Data

(60) Provisional application No. 61/225,048, filed on Jul. 13, 2009.

(51) Int. Cl.
*G03B 27/58* (2006.01)
*G03B 27/62* (2006.01)

(52) U.S. Cl.
USPC .............................................. 355/72; 355/75

(58) Field of Classification Search
USPC ..................................... 355/72, 75
See application file for complete search history.

(56) References Cited

U.S. PATENT DOCUMENTS

| | | | |
|---|---|---|---|
| 4,509,852 A | 4/1985 | Tabarelli et al. | 355/30 |
| 5,034,688 A * | 7/1991 | Moulene et al. | 324/750.03 |
| 6,605,955 B1 * | 8/2003 | Costello et al. | 324/750.09 |
| 6,780,374 B2 * | 8/2004 | Weaver et al. | 266/252 |
| 7,304,715 B2 | 12/2007 | Cadee et al. | 355/30 |
| 7,331,097 B2 * | 2/2008 | Stone et al. | 29/458 |
| 2003/0042884 A1 * | 3/2003 | Kingsley et al. | 324/96 |
| 2004/0136494 A1 | 7/2004 | Lof et al. | 378/34 |
| 2004/0207824 A1 | 10/2004 | Lof et al. | 355/30 |
| 2006/0033898 A1 * | 2/2006 | Cadee et al. | 355/53 |
| 2006/0038968 A1 | 2/2006 | Kemper et al. | 355/18 |
| 2006/0119809 A1 | 6/2006 | Verhagen et al. | 355/30 |
| 2006/0158627 A1 | 7/2006 | Kemper et al. | 355/53 |
| 2008/0137055 A1 * | 6/2008 | Hennus et al. | 355/72 |
| 2008/0267257 A1 * | 10/2008 | Herchen | 374/161 |
| 2008/0297744 A1 | 12/2008 | De Jong et al. | 355/30 |
| 2008/0299013 A1 * | 12/2008 | Trieu et al. | 422/104 |
| 2010/0227063 A1 * | 9/2010 | Amro et al. | 427/256 |
| 2011/0007288 A1 * | 1/2011 | Brinkhof et al. | 355/30 |

FOREIGN PATENT DOCUMENTS

| | | |
|---|---|---|
| EP | 1 420 300 | 5/2004 |
| WO | WO 99/49504 | 9/1999 |
| WO | WO 2005/064405 | 7/2005 |

* cited by examiner

*Primary Examiner* — Thomas R Artman
(74) *Attorney, Agent, or Firm* — Pillsbury Winthrop Shaw Pittman LLP

(57) ABSTRACT

A lithographic apparatus includes a heat transfer assembly configured to temperature control at least a portion of the lithographic apparatus. The heat transfer assembly includes a printed circuit board, and a plurality of heat transfer elements. The printed circuit board and the plurality of heat transfer elements are configured to be attached to the portion of the lithographic apparatus. The plurality of heat transfer elements are separate from and are electrically coupled to the printed circuit board.

21 Claims, 10 Drawing Sheets

HEAT TRANSFER ASSEMBLY, LITHOGRAPHIC APPARATUS AND MANUFACTURING METHOD

This application claims priority and benefit under 35 U.S.C. §119(e) to U.S. Provisional Patent Application No. 61/225,048, entitled "Heat Transfer Assembly, Lithographic Apparatus and Manufacturing Method", filed on Jul. 13, 2009. The content of that application is incorporated herein in its entirety by reference.

FIELD

The present invention relates to a heat transfer assembly, a lithographic apparatus having the heat transfer assembly, and a manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other, immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure, may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet onto the substrate W, preferably along the direction of movement of the substrate W relative to the final element, and is removed by at least one outlet after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In FIG. 2, the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that arrows in FIGS. 2 and 3 show liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that arrows in FIG. 4 show liquid flow.

In European Patent Application Publication No. EP 1420300 and United States Patent Application Publication No. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT Patent Application Publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States Patent Application Publication No. US 2006/0119809. A member is provided which covers the substrate in all positions and which is arranged to have immersion liquid extending between it and the top surface of the substrate and/or substrate table which holds the substrate.

SUMMARY

In a lithographic apparatus it is desirable to control the temperature of one or more parts of the lithographic apparatus. For example, it is desirable to keep the temperature of a part substantially constant in the face of a heating and/or cooling load on the part. Such a heating or cooling load may arise from the supply and/or removal of fluid in an immersion lithographic apparatus. As an example, gas removal may lead to undesirable evaporation of liquid adjacent that gas removal. This can in turn lead to localized cooling. Localized cooling is undesirable because it may lead to thermal contraction of the adjacent part and thereby to possible errors. Localized cooling may occur, for example, in or adjacent a liquid confinement structure, a substrate table, etc.

It is desirable, for example, to provide an improved heat transfer assembly, a lithographic apparatus having such a heat transfer assembly, and a method of manufacturing such a heat transfer assembly.

In an aspect, there is provided a lithographic apparatus that includes a heat transfer assembly configured to temperature control at least a portion of the lithographic apparatus. The heat transfer assembly includes a printed circuit board, and a plurality of heat transfer elements. The printed circuit board and the plurality of heat transfer elements are configured to be attached to the portion of the lithographic apparatus. The plurality of heat transfer elements are separate from and are electrically coupled to the printed circuit board.

In an aspect, there is provided a method of manufacturing a heat transfer assembly. The method includes providing a printed circuit board, providing a plurality of heat transfer elements that are separate from the printed circuit board, and interconnecting at least a portion of the plurality of heat transfer elements with at least a portion of the printed circuit board. The printed circuit board is configured to be attached to at least a portion of an apparatus, and the plurality of heat transfer elements are configured to be attached to the portion of the apparatus.

In an aspect, there is provided a heat transfer assembly. The heat transfer assembly includes a printed circuit board and a plurality of heat transfer elements. The printed circuit board is configured to be attached to at least a portion of an apparatus. The plurality of heat transfer elements are configured to be attached to the portion of the apparatus. The plurality of the heat transfer elements are separate from and are electrically coupled to the printed circuit board.

These and other aspects of the invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood that the drawings are for the purpose of illustration and description only and are not intended as a definition of the limits of the invention. It shall also be appreciated that the features of an embodiment disclosed herein can be used in other embodiments disclosed herein. As used in the specification and in the claims, the singular form of "a", "an", and "the" include plural referents unless the context clearly dictates otherwise.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
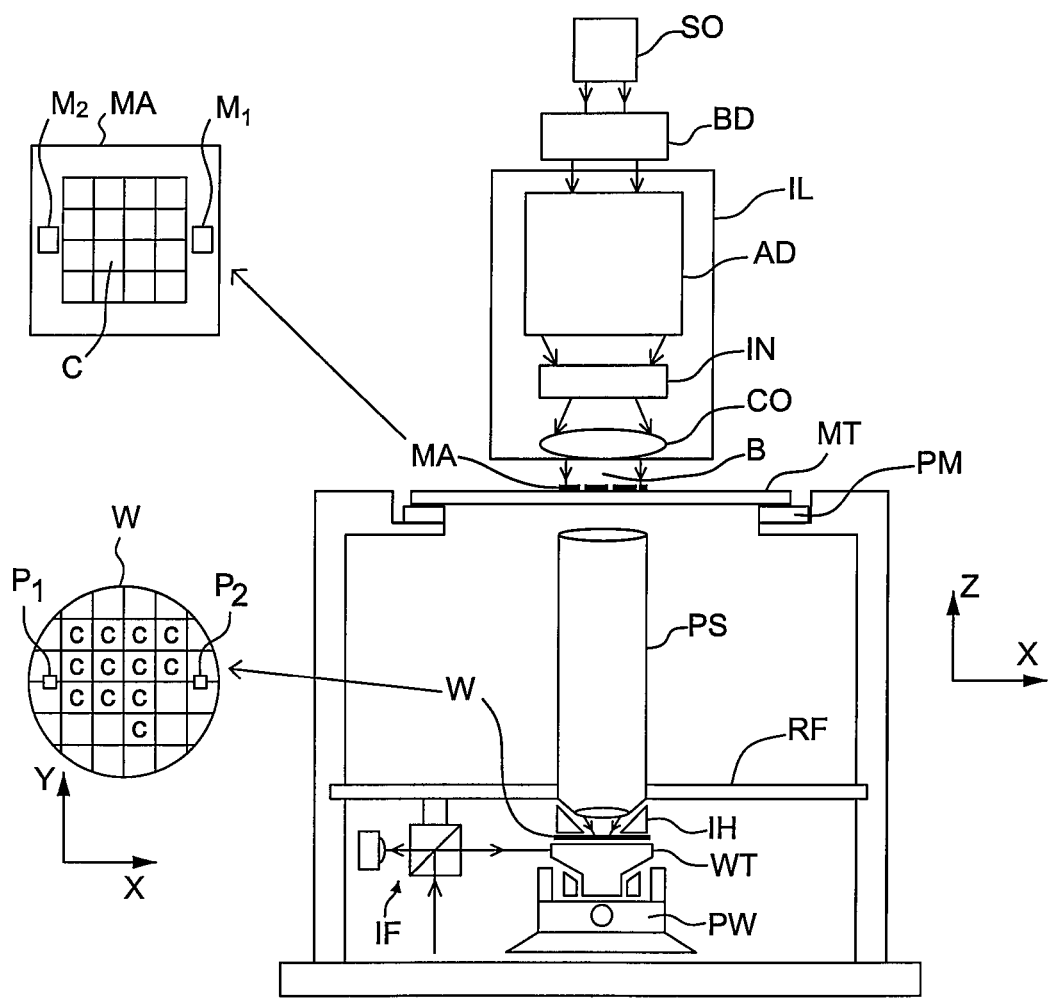
FIG. 1 illustrates a lithographic apparatus according to an embodiment of the invention.
Figure 2:
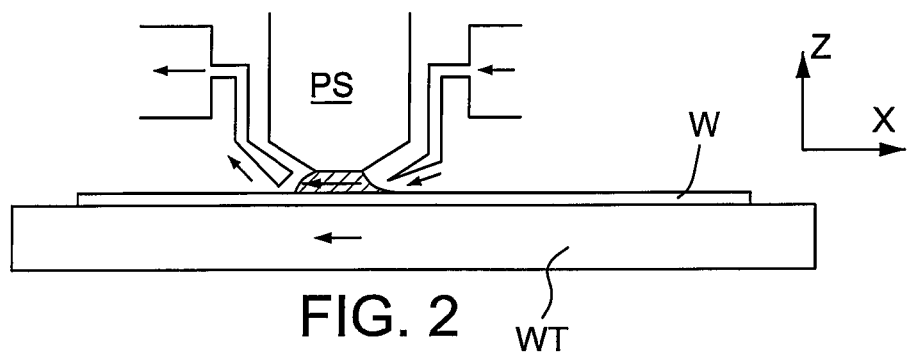
FIGS. 2 and 3 illustrate a liquid supply system for use in a lithographic projection apparatus.
Figure 3:
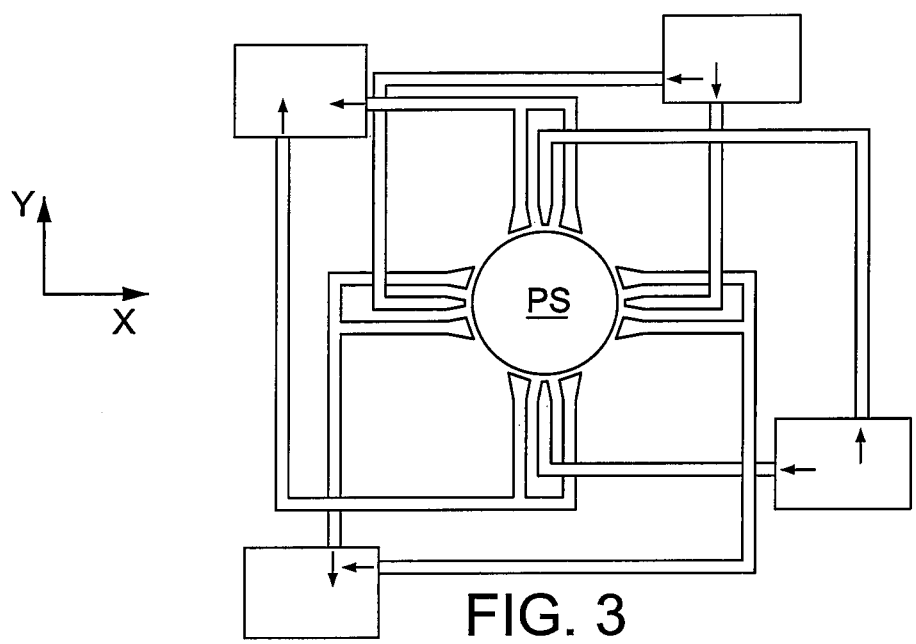
Figure 4:
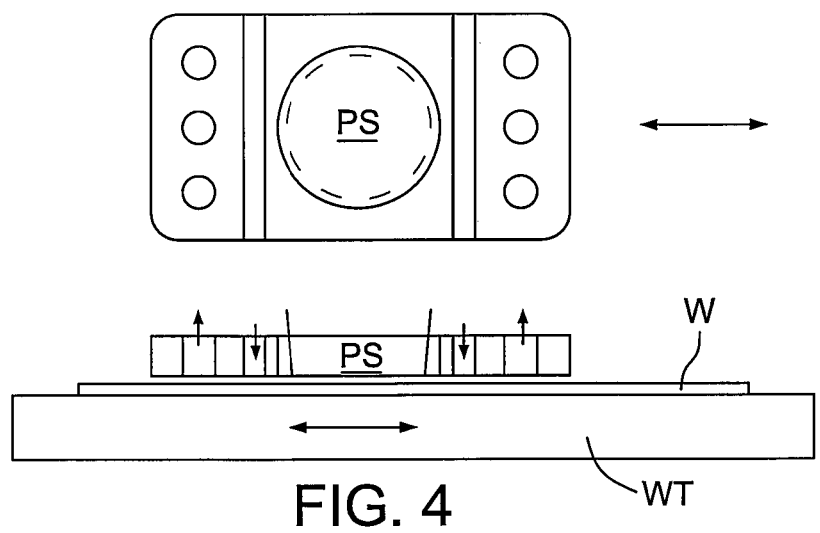
FIG. 4 illustrates a further liquid supply system for use in a lithographic projection apparatus.

FIG. 1 schematically depicts a lithographic apparatus according to an embodiment of the invention. The apparatus comprises: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device MA in accordance with certain parameters; a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable, mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam; to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM. and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate W can be classed into several general categories. A first category is the bath type arrangement in which the whole of the substrate W and optionally part of the substrate table WT is submersed in a bath of liquid. A further category is the so called localized immersion system which uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. A further category is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, a sealing feature is not present, is not activated, is not as efficient as normal or is otherwise ineffective to seal liquid to only the localized area. Four different types of localized liquid supply systems are illustrated in FIGS. 2-5. The liquid supply systems disclosed in FIGS. 2-4 were described above.

Figure 5:
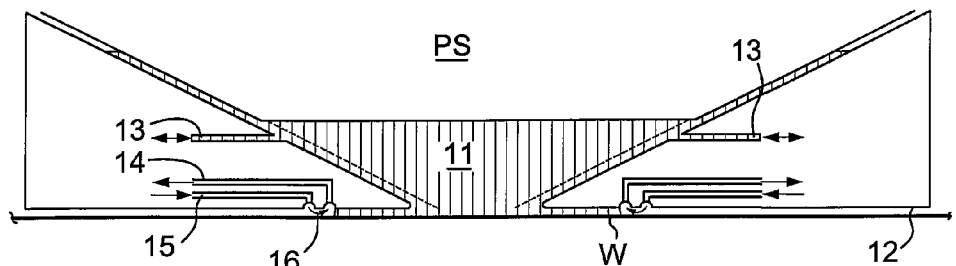
FIG. 5 illustrates a cross-sectional view of a fluid confinement structure which may be used in an embodiment of the invention.

FIG. 5 schematically depicts a localized liquid supply system with a fluid confinement structure 12, IH. The fluid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a fluid seal, desirably a gas seal. Such a system is disclosed in United States Patent Application Publication No. US 2004-0207824.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States Patent Application Publication No. US 2004-0207824.

Other arrangements are possible and, as will be clear from the description below, an embodiment of the invention may be used with or be part of any type of liquid supply system.

Figure 6:
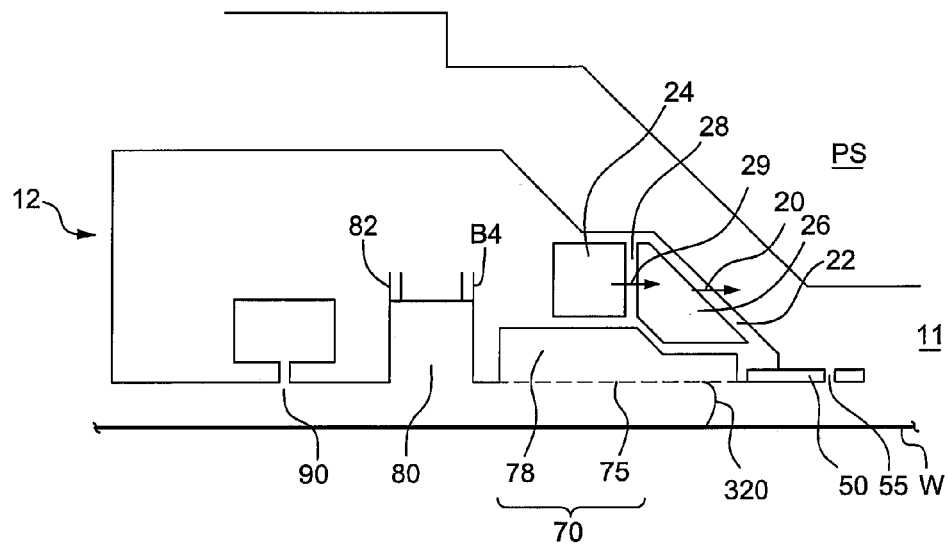
FIG. 6 illustrates a cross-sectional view of another fluid confinement structure which may be used in an embodiment of the invention.

FIG. 6 illustrates an embodiment of a liquid confinement structure 12 which is part of a liquid supply system. The liquid confinement structure 12 extends around the periphery (e.g., circumference) of the final element of the projection system PS.

A plurality of openings 20 in a surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6, a seal device is configured to provide a contactless seal and is made up of several components. Radially outwardly from the optical axis of the projection system PS, there is provided a (optional) flow control plate 50 which extends into the space 11 (though not into the path of the projection beam) which helps maintain substantially parallel flow of the immersion liquid out of outlet 20 across the space 11. The flow control plate 50 has through holes 55 in it to reduce the resistance to movement in the direction of the optical axis of the fluid confinement structure 12 relative to the projection system PS and/or substrate W.

Radially outwardly of the flow control plate 50 on the bottom surface of the fluid confinement structure 12 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 is connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 75 which is used to separate liquid from gas to enable single-liquid phase liquid extraction. An under pressure in chamber 78 is chosen is such that the meniscuses formed in the holes of the porous material 75 prevent ambient gas from being drawn into the chamber 78 of the liquid removal device 70. However, when the surface of the porous material 75 comes into contact with liquid there is no meniscus to restrict flow and the liquid can flow freely into the chamber 78 of the liquid removal device 70. The surface of the porous material 75 extends radially inwardly along the fluid confinement structure 12 (as well as around the space 11). The rate of extraction through the surface of the porous material 75 varies according to how much of the porous material 75 is covered by liquid.

The porous material 75 has a large number of small holes each with a dimension, e.g. a width, such as a diameter, $d_{hole}$ in the range of 5 to 50 mm. The porous material 75 may be maintained at a height in the range of 50 to 300 mm above a surface from which liquid is to be removed, e.g. the surface of a substrate W. In an embodiment, porous material 75 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

In an immersion lithographic apparatus, a substrate is normally positioned in a recess within the substrate table. In order to account for variations in the width (e.g., diameter) of the substrate, the recess is usually made a little larger than the maximum likely size of the substrate. Therefore there exists a gap between the edge of the substrate and the substrate table. With all arrangements for providing liquid, there may be a difficulty in the treatment of the gap between the substrate and the substrate table. This is because liquid can enter this gap. It is desirable to remove liquid from the gap to prevent it from working its way under the substrate. It is also desirable to prevent bubbles of gas entering the immersion liquid from the gap. For this purpose an inlet may be provided below the gap between the edge of the substrate and substrate table. The inlet is connected to an underpressure source so that liquid and/or gas can be removed from the gap.

Figure 7:
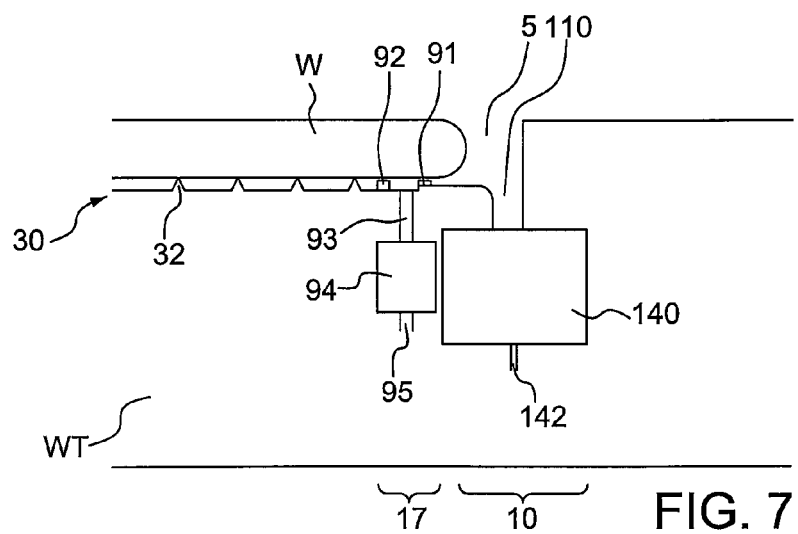
FIG. 7 illustrates a cross-sectional view of a portion of a substrate table surrounding the edge of a substrate.

FIG. 7 is a schematic cross-section through a substrate table WT and a substrate W that is supported on a substrate supporting area of the substrate table WT. A gap 5 exists between an edge of the substrate W and an edge of the substrate table WT. The gap 5 is at an outer area or edge of a recess in which the substrate W is placed during imaging. In an immersion lithography machine using a localized area liquid supply system, when the edge of the substrate W is being imaged (or at other times such as when the substrate W first moves under the projection system PS, as described above), the gap 5 will pass under, for example, the space 11 filled with liquid by the liquid supply system 12. This can result in liquid from the space 11 entering the gap 5. In other liquid supply systems, liquid can enter the gap 5 at any time.

In order to deal with the liquid entering that the gap 5, at least one drain 10, 17 may be provided at the edge of the substrate W to remove any liquid which enters the gap 5. In the embodiment of FIG. 7, two drains 10, 17 are illustrated though there may be only one drain or there could be more than two drains. The drains 10, 17 are, for example, annular so that the whole periphery of the substrate W is surrounded.

The primary function of the first drain 10 is to prevent bubbles of gas from entering the liquid 11 of the liquid supply system 12. Any such bubbles can deleteriously affect the imaging of the substrate W. The provision of the second drain 17 under a pimple table 30 reduces or eliminates problems which may occur due to liquid finding its way from the gap 5 to underneath the substrate W. Liquid underneath the substrate W may, for example, prevent efficient release of the substrate W from the substrate table WT after imaging and/or cause warpage of the substrate. As is conventional, the substrate W is held by the pimple table 30 comprising, a plurality of projections 32. An underpressure applied between the substrate W and the substrate table WT by the pimple table 30 ensures that the substrate W is held firmly in place. However, if liquid gets between the substrate W and the pimple table 30, this can lead to difficulties, particularly when unloading the substrate W.

The first drain 10 is connected via outlet 142 to an underpressure source, which effectively removes liquid which enters the first drain 10. The under pressure source is effective to draw gas in from outside of the gap 5 above the substrate table WT through the first drain 10 and out through the outlet 142. Measures may be taken only to connect, the outlet 142 to the under pressure source when there is a chance of liquid entering the gap 5.

Typically the first drain 10 comprises an inlet 110 which puts a chamber 140 into fluid communication with the gap 5. The chamber 140 may be annular, for example. The outlet(s) 142 is in fluid communication with the chamber 140. The chamber 140 is useful in helping to damp pressure variations and thereby reduce vibrations. The drawing of gas and/or liquid through the inlet 110 (which may be a continuous groove or a plurality of individual through holes) can lead to the evaporation of liquid which has entered the gap 5. The evaporation of liquid leads to localized cooling. Localized cooling can result in mechanical contractions of the surrounding substrate table WT which in turn may lead to overlay errors.

The second drain 17 comprises an outlet 95 that is held at an under pressure (e.g. 0.6 bar) which is a little larger than the under pressure (e.g. 0.5 bar) of the pimple table 30. This helps ensure that there is a flow of gas from the pimple table 30 as well as from the gap 5 to the outlet 95. In an alternative embodiment, the second drain 17 can be held at an over pressure. In this case there is a flow of gas out of the outlet 95 towards the gap 5. Combined with capillary pressure this can be used to reduce or prevent immersion liquid getting to between the pimple table 30 and the substrate W.

As can be seen, two projections 91 and 92 are provided underneath the substrate W. The radially outer projection 91 is a so-called "wet seal" and is likely to have immersion liquid passing between it and the bottom surface of the substrate W. The radially inner projection 92 is a "dry seal" and substantially only gas is likely to pass between it and the substrate W.

Between the two projections 91, 92 is a channel 93 which leads to a chamber 94. The chamber 94 is in fluid communication with the outlet 95 which is connected to the under pressure source. More detail of this second drain 17 and of the first drain 10 can be found in United States Patent Application Publication No. US 2008-0297744.

As discussed above, a heating or cooling load may deleteriously affect the temperature stability of a part of a lithographic apparatus. Such a heating or cooling load is undesirable because it may lead to thermal expansion/contraction of the part (e.g., a substrate table or liquid confinement structure) and thereby lead to possible errors (e.g., overlay errors). A cooling load may arise due to undesirable evaporation of liquid. Such evaporation may occur, for example, due to gas removal through a liquid confinement structure or by removal of gas through the gap between the substrate and the substrate table. Accordingly, a heat transfer assembly may be provided to control the temperature of a part of a lithographic apparatus.

Figure 8:
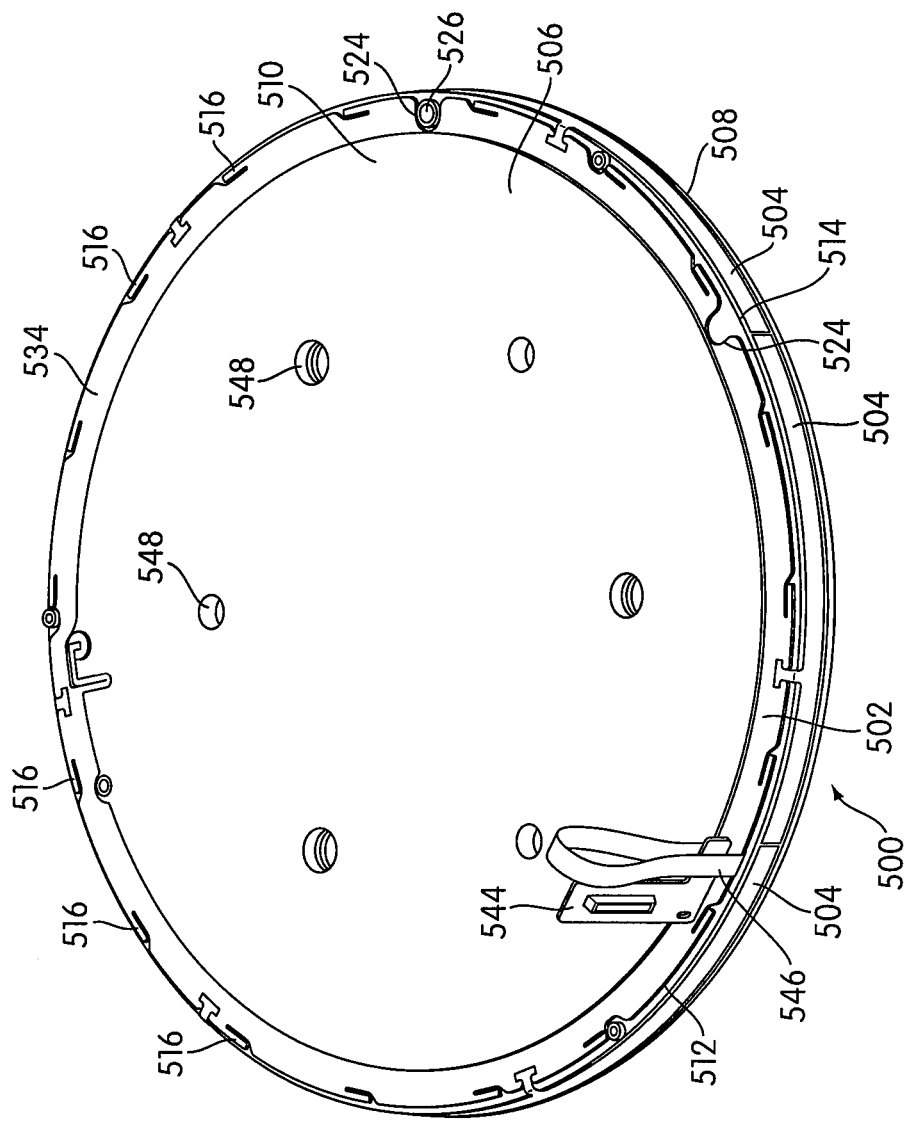
FIG. 8 illustrates a bottom perspective view of a substrate table with a heat transfer assembly attached to a substrate table in accordance with an embodiment of the invention.
Figure 9:
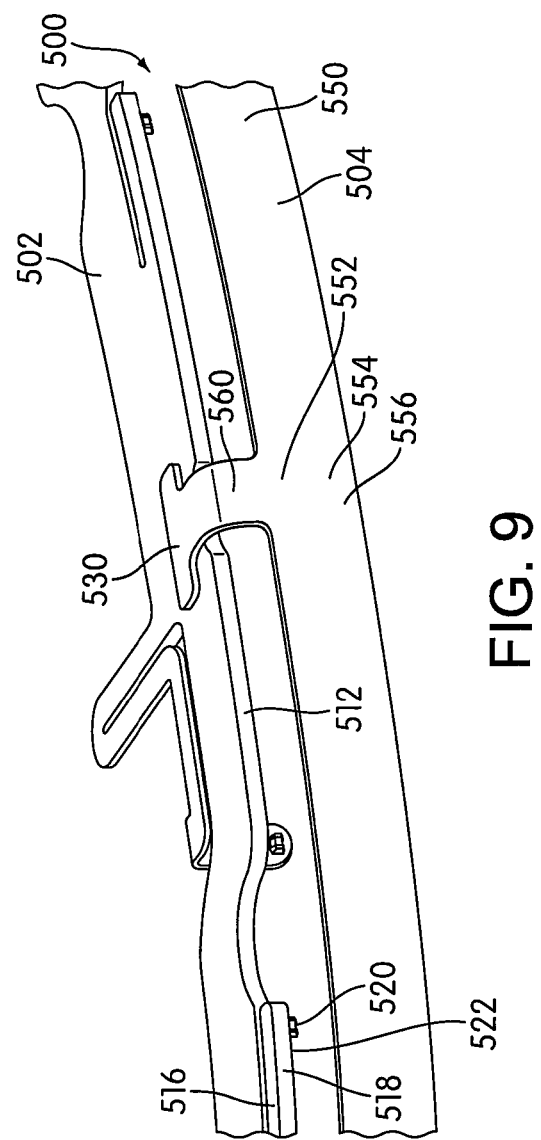
FIG. 9 illustrates a perspective view of the heat transfer assembly in accordance with an embodiment of the invention.
Figure 10:
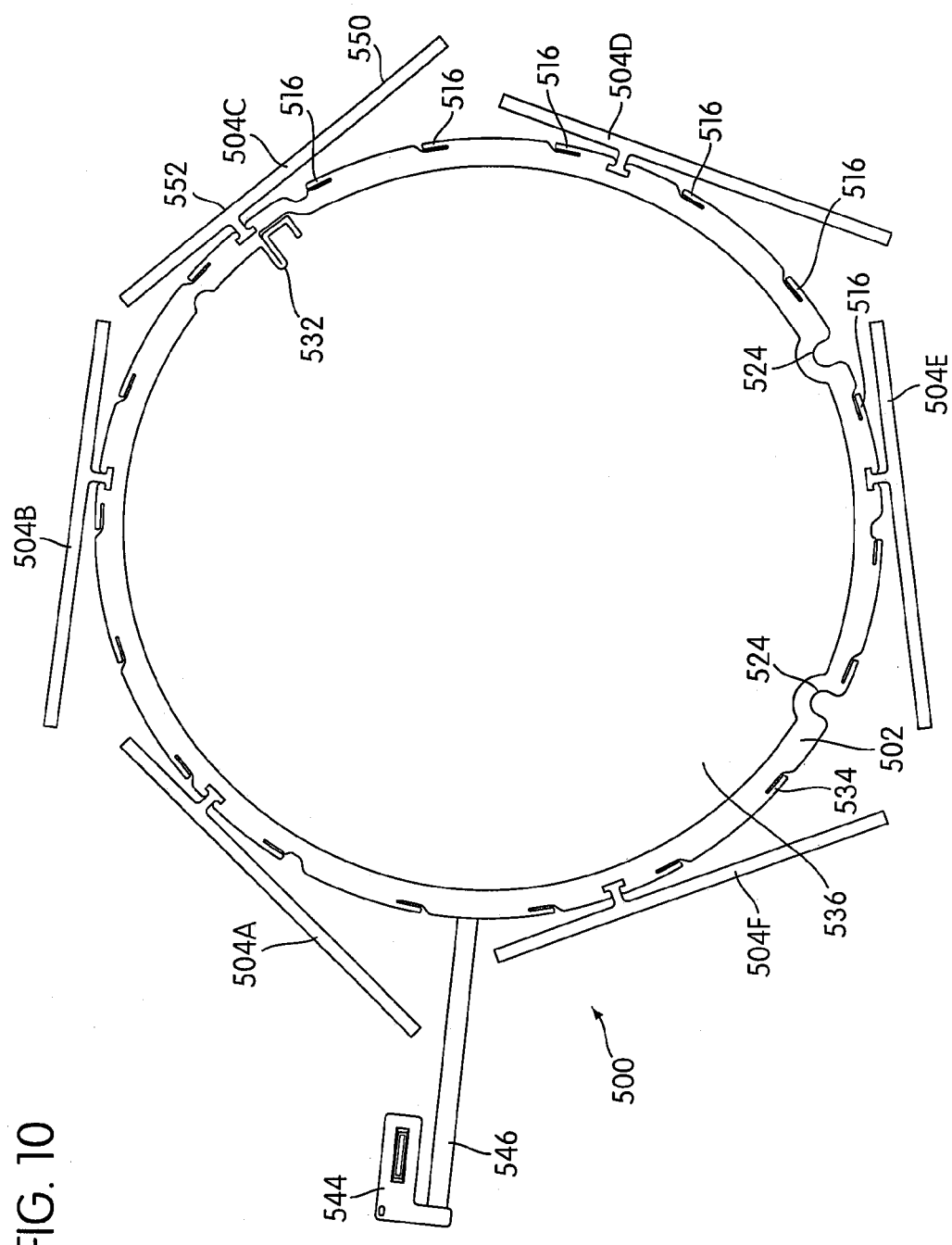
FIG. 10 illustrates a bottom view of the heat transfer assembly in accordance with an embodiment of the invention.

FIGS. 8, 9 and 10 show a heat transfer assembly 500 in accordance with an embodiment of the invention. In an embodiment, the heat transfer assembly 500 is configured to heat at least a portion of a lithographic apparatus (as shown in FIG. 1). The heat transfer assembly 500 includes a printed circuit board 502, and a plurality of heat transfer elements 504. The printed circuit board 502 and the plurality of heat transfer elements 504 are configured to be attached to the same portion of the lithographic apparatus (as shown in FIG. 1). In other words, the plurality of heat transfer elements 504 is configured to be attached to a portion of the lithographic apparatus (as shown in FIG. 1) to which the printed circuit board 502 is attached. The plurality of heat transfer elements 504 are separate from and are electrically coupled to the printed circuit board 502. In other words, the plurality of heat transfer elements 504 are not integrally formed with the printed circuit board 502. In FIG. 8, three heat transfer elements 504 are labeled although six heat transfer elements 504 are shown. Any number of heat transfer elements 504 may be provided.

In the illustrated embodiment, as shown in FIG. 8, the portion of the lithographic apparatus is a substrate table 506. It is contemplated, however, that the heat transfer assembly 500 may be attached to any portion of the lithographic apparatus that requires thermal control, for example, a part of a liquid confinement structure that confines immersion liquid in, supplies immersion liquid to and/or removes immersion liquid from, a space between the final element of the projection system PL (as shown in FIG. 1) and the substrate W (as shown in FIG. 1), a closing structure (i.e., a surface used to contain liquid adjacent in a liquid confinement structure when the substrate table is moved away from the liquid confinement structure and may include a table, separate from the substrate table, movable to under the liquid confinement structure or a swap bridge located or locatable between two or more substrate tables to allow one substrate table to move underneath the liquid confinement structure in place of the other substrate table), a sensor in the lithographic apparatus, or any other component of the lithographic apparatus that could use heat transfer control.

In an embodiment, as shown in FIG. 8, the substrate table 506 includes an upwardly-facing surface 508 and a downwardly-facing surface 510. In an embodiment, the upwardly-facing surface 508 is in the form of a substrate supporting area 508 that is constructed and arranged to support the substrate W (as shown in FIG. 1) on the substrate table 506. The downwardly-facing surface 510 is constructed and arranged to engage with an inner surface 512 of the printed circuit board 502. In other words, the printed circuit board 502 is attached on the surface 510 of the substrate table 506 that is opposite the substrate supporting area 508. Thus, in practice, the heating assembly of FIG. 8 and the substrate table 506 would typically be flipped over in typical use.

In an embodiment, as shown in. FIG. 8, the substrate table 506 may generally include a plurality of through holes 548 that enable pins (not shown) to pass therethrough to enable separation of the substrate W from the substrate supporting area 508 of the substrate table 506 and/or that allow an under pressure to be applied to a substrate supported in use on the substrate supporting area 508 to hold the substrate on that area 508.

In an embodiment, as shown in FIG. 10, the printed circuit board 502 may include ring-shaped portion 534 having an aperture 536 located centrally thereof. In an embodiment, the printed circuit board 502 may be a flexible printed circuit board. The printed circuit board 502 may include a plurality of attachment members 516 that are constructed and arranged to attach the inner surface 512 (as shown in FIG. 8) of the printed circuit board 502 to the downwardly-facing surface 510 of the substrate table 506. In the illustrated embodiment, as just one example is shown in FIGS. 8 and 10, the plurality of attachment members 516 may include eighteen attachment members 516 that are generally positioned evenly distributed along the printed circuit board 502. However, the number of attachment members 516 that are generally positioned along the printed circuit board 502 can vary in number.

In the illustrated embodiment, as shown in FIG. 9, the attachment member 516 includes an attachment portion 518. The attachment portion 518 is constructed and arranged to engage with engaging members (not shown) located on the downwardly-facing surface 510 (as shown in FIG. 8) of the substrate table 506 to attach the printed circuit board 502 with the substrate table 506 (as shown in FIG. 8).

In an embodiment, as shown in FIGS. 8 and 10, the printed circuit board 502 may include a plurality of cut-out regions 524 that are constructed and arranged to engage with a plurality of protruding members 526 positioned on the downwardly-facing surface 510 of the substrate table 506 to align and to attach the printed circuit board 502 to the substrate table 506. In the illustrated embodiment, as just one example is shown in FIGS. 8 and 10, the plurality of cut-out regions 524 may include two cut-out regions 524, and the plurality of protruding members 526 may include two protruding members 526. However, the number of cut-out regions 524 that are generally positioned on the printed circuit board 502 and the protruding members 526 that are generally positioned on the substrate table 506 can vary in number. In the illustrated embodiment, the cut-out regions 524 may generally have a semi-circular shaped configuration and the protruding members 526 may generally have a circular shaped configuration. It should be appreciated, however, that this embodiment, is but one example of different types of the protruding members and cut-out regions shapes, configurations and/or constructions that can be provided.

In an embodiment, as shown in FIGS. 8 and 10, the printed circuit board 502 may include a power supply terminal 544 constructed and arranged to provide electric power to the printed circuit board 502 and the plurality of heat transfer elements 504. In an embodiment, the power supply terminal 544 is connected to the ring-shaped portion 534 of the printed circuit board 502 using a flexible (or bendable) extension member 546.

In an embodiment, as shown in FIG. 10, the printed circuit board 502 includes an extension portion 532 that is constructed and arranged to provide some slack to the printed circuit board 502 and to facilitate thermal expansion and/or contraction of the ring-shaped portion 534 of the printed circuit board 502. In an embodiment, the amount of slack may be determined based on the coefficient of thermal expansion of the material of the printed circuit board 502 and/or the radii of the ring-shaped portion 534 of the printed circuit board 502.

In the illustrated embodiment, as just one example is shown in FIGS. 8 and 10, the plurality of heat transfer elements 504 of the heat transfer assembly 500 may include six heat transfer elements 504A-F that are positioned to extend substantially around an edge 514 of the substrate supporting area 508. However, the number of heat transfer elements 504 that are positioned to extend substantially around the edge 514 of the substrate supporting area 508 can vary in number. In an embodiment, each of the plurality of heat transfer elements 504 may include an arc-shaped configuration. It should be appreciated, however, that this embodiment, is but one example of different types of the heat transfer element shapes, configurations and/or constructions that can be provided. In an embodiment, the heat transfer element 504 may include a heating resistor that is constructed and arranged to generate heat, where the amount of heat generated by the heat transfer element is based on the amount of power supply provided to the heating resistor. In an embodiment, the heat transfer element 504 may a cooling device that is constructed and arranged to cause cooling, such as a Peltier element.

Figure 11:
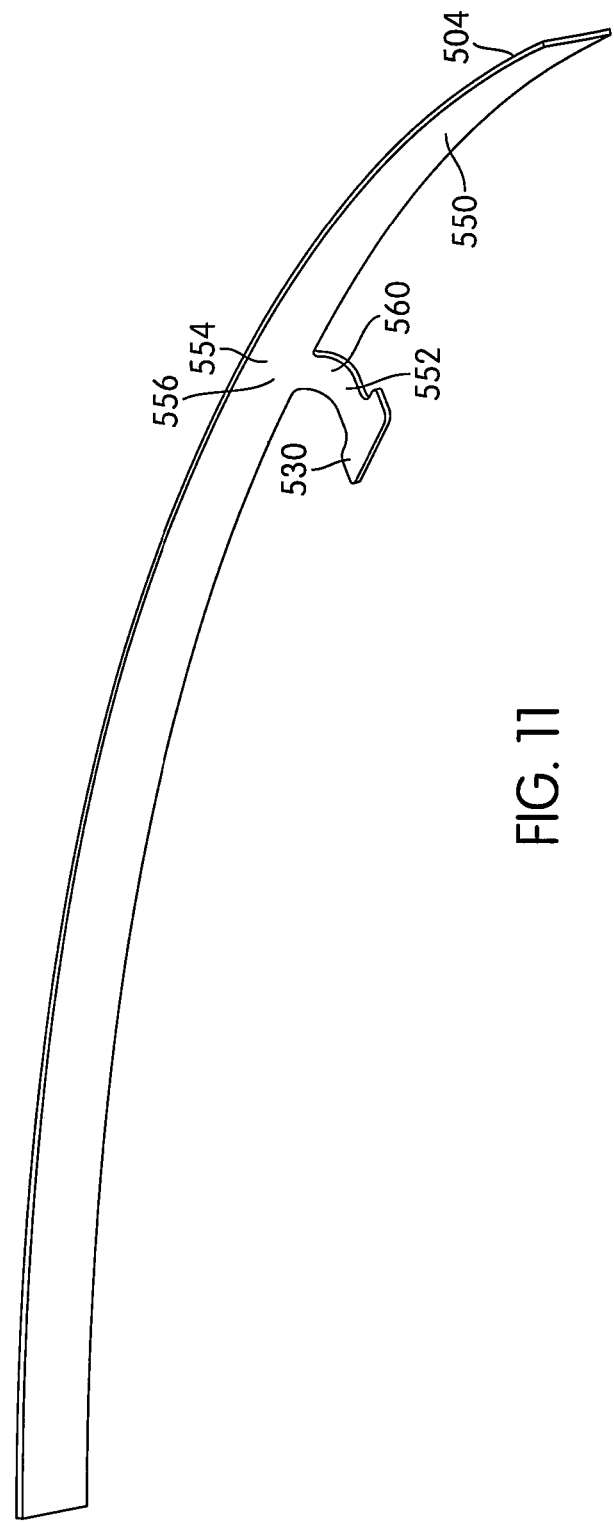
FIG. 11 illustrates a perspective view of a heat transfer element in accordance with an embodiment of the invention.
Figure 12:
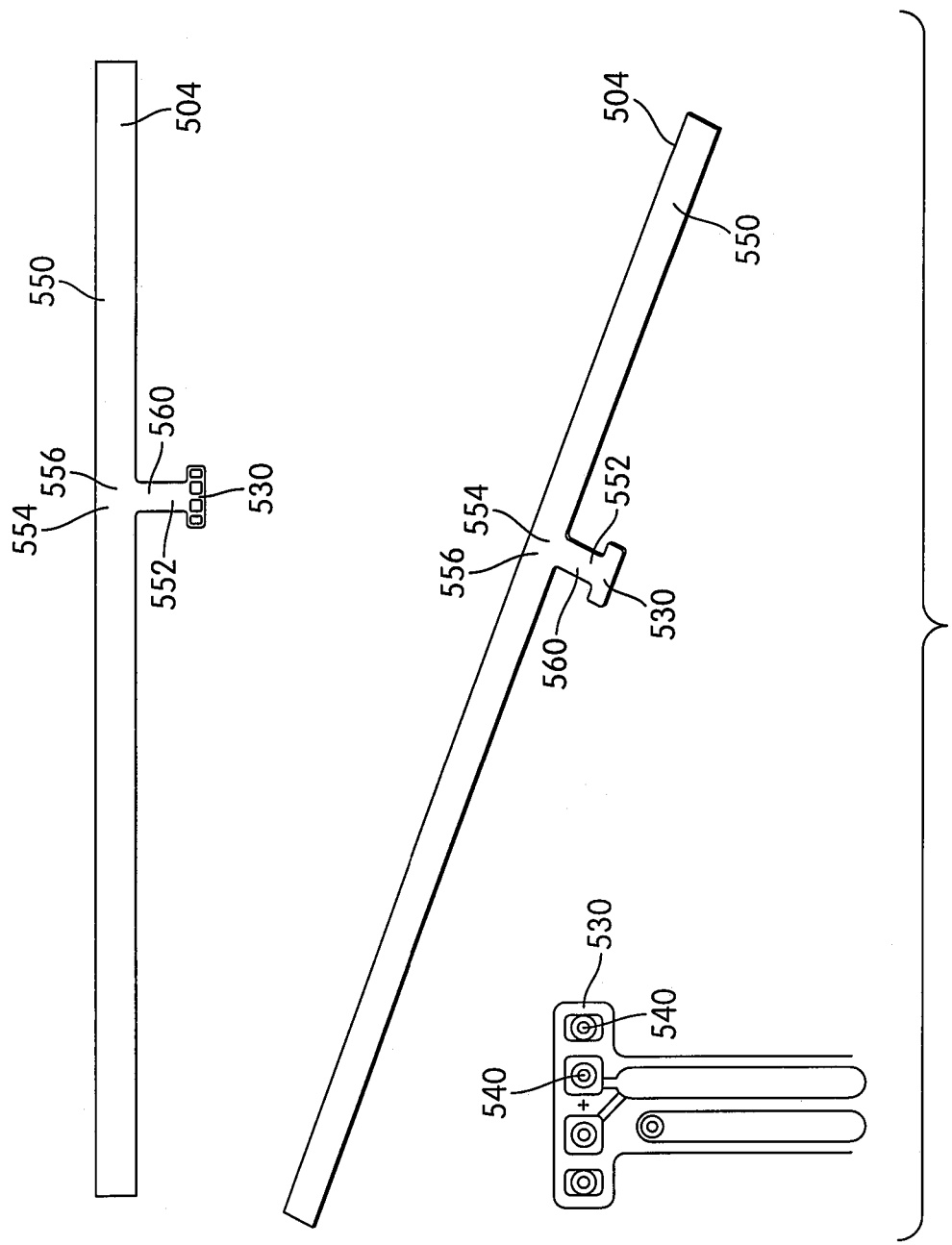
FIG. 12 illustrates a bottom view of the heat transfer element in accordance with an embodiment of the invention.

As shown in FIGS. 10, 11, and 12, the heat transfer element 504 may include a first member 550 and a second member 552. In the illustrated embodiment, as shown in FIGS. 10-12, the second member 552 generally extends from and is perpendicular to the first member 550, when the first member 550 and the second member 552 lie in the same plane. In the illustrated embodiment, the first member 550 is generally rectangular in shape and the second member 552 may generally include a T-shaped or an I-shaped configuration. In an embodiment, the first member 550 and the second member 552 are integral, i.e., formed from a single piece of material.

In an embodiment, the first member 550 may include a first connecting portion 554 that is constructed and arranged to connect with a second connecting portion 556 of the second member 552 to connect the first member 550 with the second member 552. The first connecting portion 554 of the first member 550 and the second connecting portion 556 of the second member 552 may be attached to each other using adhesive bonding, gluing, welding, or any other attachment method as will be appreciated by one skilled in the art.

As shown in FIGS. 10-12, in an embodiment, the first member 550 and the second member 552 of the heat transfer element 504 may generally lie in the same plane as the ring-shaped portion 534 of the printed circuit board 502, when the second member 552 of the heat transfer element 504 has not been bent.

The second member 552 may include a second engaging member 530 that is constructed and arranged to facilitate a connection between the heat transfer element 504 and the printed circuit board 502. The second member 552 may include a flexible (or bendable) portion 560 that is located in between the second engaging member 530 and the second connecting portion 556. The flexible (or bendable) portion 560 is constructed and arranged to be bent so that the second engaging member 530 of the second member 552 lies in a plane that is generally perpendicular to a plane of the second connecting portion 556.

Figure 13:
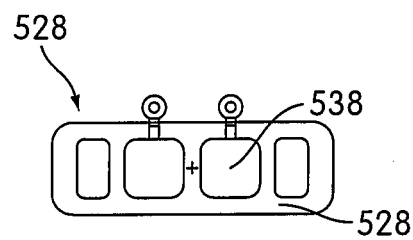
FIG. 13 illustrates a first engaging member of a printed circuit board in accordance with an embodiment of the invention.
Figure 14:
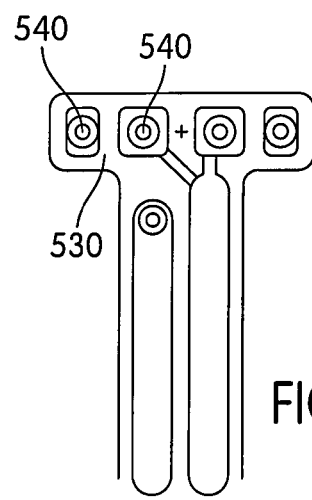
FIG. 14 illustrates a second engaging member of the heat transfer element in accordance with an embodiment of the invention.

In an embodiment, as shown in FIG. 13, first engaging member 528 is an integral portion of the printed circuit board 502 and is constructed and arranged to engage with a corresponding second engaging member 530 (as shown in FIGS. 12 and 14) located on the heat transfer element 504 to connect the heat transfer element 504 with the printed circuit board 502.

Figure 15:
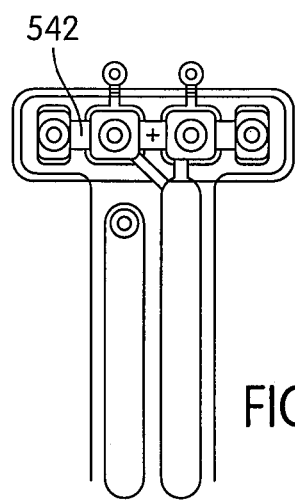
FIG. 15 illustrates an interconnect assembly with the first engaging member of the printed circuit board connected with the second engaging member of the heat transfer element in accordance with an embodiment of the invention.

In an embodiment, the plurality of heat transfer elements 504 are coupled or connected to the printed circuit board 502 by a soldering process. As shown in FIGS. 13-15, the first engaging member 528 and the second engaging member 530 may include solder locations 538 and 540 respectively. Solder locations 538, or solder locations 540, or both, may be covered with solder material. The solder locations 538 and/or 540 having solder material are constructed and arranged to reflow the solder material and to create solder joints 542 between each of the soldering locations that match when the first engaging member 528 and the second engaging member 530 are positioned on top of each other. The plurality of heat transfer elements 504 may thus be electrically and physically connected with the printed circuit board 502 at the solder joints 542. It should be appreciated, however, that this embodiment, is but one example of different types of solder joints, and/or engaging member shapes, configurations and/or constructions that can be provided.

In an embodiment, the first and the second engaging members 528 and 530 are placed on each other and soldered together using a thermode hotbar reflow solder process, thus, providing a solder connection that can be removed or replaced when needed. During the thermode hotbar reflow solder process, the first and the second engaging members 528 and 530 are placed on top of each other and are together placed in between a thermode hotbar and a hot plate of a thermode hotbar reflow solder apparatus to obtain a standard, reliable solder connection. In general, a thermode hotbar reflow soldering process includes heating two pre-fluxed, solder coated components (e.g., the first and the second engaging members 528 and 530) with a heating element (e.g., a thermode) to a sufficient temperature so as to melt the solder. In order to ensure that components stay in place during the cooling process, pressure is applied during the soldering process. The heating element is heated and cooled for each connection.

By making the heat transfer elements 504 and the printed circuit board 502 modular, the components (i.e., the printed circuit board 502, and the heat transfer elements 504) of the heat transfer assembly 500 may be easily assembled. The plurality of heat transfer elements 504 may be coupled or connected to the printed circuit board 502 by an alternative or additional attachment process, for example, a lamination process, a welding process, an electrically conductive gluing process, or a wire bonding process. In an embodiment, a zero insertion force (ZIF) type connector, flexible printed circuit (FPC) type connector, or flexible flat cable (FFC) type connector may be used to facilitate a connection between the printed circuit board 502 and the heat transfer element 504. In an embodiment, an anisotropic conductive film (ACF) may be used to facilitate a connection between the printed circuit board 502 and the heat transfer element 504.

In an embodiment, at least one of the plurality of heat transfer elements 504 is releasably connected to the printed circuit board 502. Thus, if one of the two components (i.e., the printed circuit board 502, or the heat transfer elements 504) of the heat transfer assembly 500 is damaged, the modular design of the heat transfer assembly 500 enables readily replacement of only the damaged component of the heat transfer assembly 500 without having to replace both components (i.e., the heat transfer elements 504 and the printed circuit board 502) of the heat transfer assembly 500.

Further, the modular design can facilitate upgrade of the printed circuit board 502 (i.e., without damaging or replacing the heat transfer elements 504), and/or upgrade of the heat transfer elements 504 (i.e., without damaging or replacing the printed circuit board 502). This facilitates printed circuit board upgrades, heat transfer element upgrades and refurbishment or overhauling old machines or substrate table modules.

The modular design of the heat transfer assembly 500 may reduce the cost of the components (the heat transfer elements 504 and the printed circuit board 502) of the heat transfer assembly 500 due to the possibility of manufacturing separate components at multiple or different suppliers, and due to the possibility of using simpler standard manufacturing technologies with higher yield. In other words, the modular design of the heat transfer assembly 500 may allow the heat transfer elements 504 to be produced by one or more heat transfer element manufacturers with its technologies/processes and the printed circuit board 502 to be produced by one or more printed circuit board manufacturers with its processes/technologies and the heat transfer assembly 500 to be assembled at one or more printed circuit assemblers. If needed, the flexible printed circuit boards 502 and the heat transfer elements 504 could be easily improved or changed with low costs. Therefore, the modular design of the heat transfer assembly 500 may facilitate improving the total design of the heat transfer assembly 500 by using standard technologies, thus improving yield and reliability of the heat transfer assembly 500.

The modular design of the heat transfer assembly 500 may allow the components (the heat transfer elements 504 and the printed circuit board 502) of the heat transfer assembly 500 to be checked separately, enabling a tighter manufacturing tolerance (more accurate) and better diagnosis/troubleshooting.

At least one of the plurality of heat transfer elements 504 is moveable separately from the printed circuit board 502 so as to align the at least one of the plurality of heat transfer elements 504 around the edge 514 of the substrate supporting area 508 separately from the printed circuit board 502.

In an embodiment, a method of manufacturing the heat transfer assembly 500 is provided. The method includes providing a printed circuit board 502, providing a plurality of heat transfer elements 504 that are separate from the printed circuit board 502, and interconnecting the plurality of heat transfer elements 504 with the printed circuit board 502. The printed circuit board 502 is configured to be attached to at least a portion of an apparatus and the plurality of heat transfer elements 504 is configured to be attached to the portion of the apparatus. In an embodiment, the apparatus may be a lithographic apparatus (as shown in FIG. 1).

In an embodiment, the position of the heat transfer elements is chosen according to the design of the part to which it is attached. For example, a particular portion of the part may experience a higher heat transfer load than another portion of the part. For example, an inlet of a substrate table or a liquid confinement structure may experience greater localized cooling than another portion of the part. As a further example, a portion of the substrate table adjacent an edge of the substrate may experience greater localized cooling when that edge passes under the localized liquid space of an immersion lithography liquid handling system. In those or other cases, at least one heat transfer element can be placed close to the applicable area (e.g., inlet or substrate table portion near an edge of the substrate) with optionally other heat transfer elements present elsewhere.

In an embodiment, the heat transfer assembly 500 may include one or more sensors. In an embodiment, the sensor may be integral in the printed circuit board 502. In an embodiment, the sensor may be separately attached to the printed circuit 502 similar to a heat transfer element 504 or as part of a heat transfer element 504. A separately attachable sensor facilitates sensor upgrade or replacement without replacement of the printed circuit board 502.

In an embodiment, the sensor includes a temperature sensor. The temperature sensor could be a point sensor. In that case, it is likely that more than one temperature sensor per heat transfer element may be needed. For any particular arrangement of heat transfer elements, the thermal response may be better if the response is controlled by the signal from three temperature sensors per heat transfer element rather than just one temperature sensor. An average of the sensors should be taken. The sensors may be connected in parallel or in series. In an embodiment, the temperature sensor could be a ribbon sensor which by its nature averages the temperature over an area. The sensor could, for example, as shown in FIG. 9, be a negative temperature co-efficient (NTC) sensor 520 which is mounted on a surface 522 of the attachment portion 518.

In an embodiment, a controller may be provided. The controller attempts to maintain the measured temperature at a given set point. The faster the response the better the performance which can be expected. The faster the thermal time constants, the smaller the net maximum temperature change which will occur on the application of a thermal load. The controller may control the heat transfer element based on feedback from one or more sensors. Feed forward control is possible based on, for example, the relative location of the liquid handling system.

Although an embodiment of the invention has been described above with reference to an immersion lithographic apparatus, this need not necessarily be the case. Other types of apparatus may suffer from uneven cooling (or heating). For example, in an extreme ultraviolet (EUV) radiation lithographic apparatus, heating due to the impingement of the projection beam can occur. This can give a localized heating to a part of the apparatus, such as a substrate table. If the part is given a small negative temperature offset with respect to the desired temperature in a normal operating condition, a local cooling load can then be applied by switching a heat transfer element off. Alternatively or additionally, the heat transfer element may be cooled, e.g., by using Peltier element of the heat transfer element. Therefore, as can be seen, an embodiment of the invention can be implemented in any type of apparatus, whether a lithographic apparatus or not.

The heat transfer elements may be placed at any relevant location. For example, in the case of a substrate table, the heat transfer element may be, located at different radial distances from a center of a substrate supporting area of the substrate table.

Figure 16:
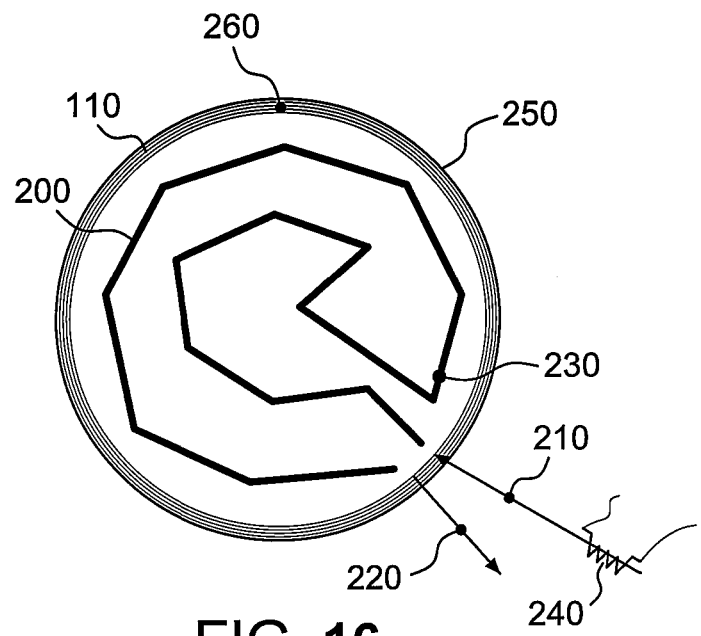
FIG. 16 illustrates, in plan, a central section of a substrate table according to an embodiment of the invention.

FIG. 16 illustrates an application of the heat transfer assembly 500 in the context of a substrate table WT. FIG. 16 is a plan view of the substrate support area of a substrate table WT. The inlet 110 as indicated puts a chamber 140 into fluid communication with the gap 5 (as shown in FIG. 7). A central channel 200 for heat transfer fluid is provided. The central channel 200 follows a path under the position of the substrate W. The path of the central channel 200 is such that an even heating can be applied by passing a heating fluid through the channel 200. The temperature of the heat transfer fluid entering the channel 200 is detected by a first temperature sensor 210. The temperature of heat transfer fluid exiting the channel 200 is detected by a second temperature sensor 220. A third temperature sensor 230 may be provided in the channel 200 to detect the temperature at a local point. A controller can be provided with data from the temperature sensors 210, 220, 230 and can control the temperature of the heat transfer fluid using a heater 240 which is used to heat transfer fluid prior to the heat transfer fluid entering the channel 200.

In order to deal with the excessive cooling which can be generated by the first drain 10 (as shown in FIG. 7), an embodiment of the heat transfer assembly 500 may provide as a heating element 250. The heating element 250 is a single heating element which is adjacent the inlet 110 and extends around the periphery (e.g., circumference) of the inlet 110.

The heating element 250 may be positioned underneath the chamber 140 or on either side of the chamber 140, as illustrated in FIG. 7. There may be other appropriate positions for the heating element 250.

A fourth temperature sensor 260 is provided. The fourth temperature sensor 260 is provided in the vicinity of the inlet 110. A controller can use the information obtained from the fourth temperature sensor 260 to control the power applied to the heating element 250.

Figure 17:
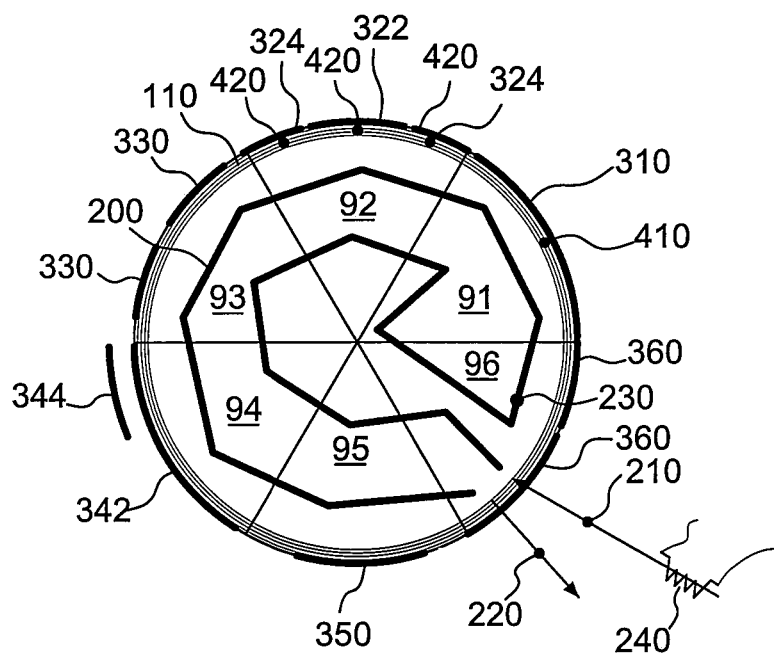
FIG. 17 illustrates, in plan, a central section of a substrate table according to an embodiment of the present invention.

FIG. 17 illustrates a further application of the heat transfer assembly 500 in the context of a substrate table WT. FIG. 17 illustrates in plan the substrate support area just like in FIG. 16. A plurality of heat transfer elements 310, 322, 324, 330, 342, 344, 350, 360 (like heat transfer elements 504) are provided adjacent the inlet 110. At least two of the plurality of heat transfer elements 310, 322, 324, 330, 342, 344, 350, 360 are positioned along different segments of an edge of the substrate supporting area. That is, the periphery of the inlet 110 is segmented and each segment has at least one heat transfer element 310, 322, 324, 330, 342, 344, 350, 360 associated with it. In an embodiment, the periphery of the inlet 110 has been split into six sections or segments. Each section or segment is provided with at least one heat transfer element 310, 322, 324, 330, 342, 344, 350, 360. In FIG. 17 for illustration purposes each section is provided with a different combination of heat transfer elements 310, 322, 324, 330, 342, 344, 350, 360. However, it will be appreciated that any combination of heat transfer elements may be used and indeed all of the sections may have the same heat transfer element configuration or only some of the sections may have the same heat transfer element configuration.

In the first segment 91, only a single heat transfer element 310 is present. The single heat transfer element 310 extends along the entire length of the segment 91. In the second segment 92 three heat transfer elements 322, 324 are illustrated. The heat transfer elements 322, 324 are of the same length and together extend along the entire length of the segment 92.

In the third segment 93, two heat transfer elements 330 are provided. These heat transfer elements 330 are short heat transfer elements and do not cover, even together, the entire length of the third segment 93.

The power of the heat transfer elements is chosen closely to match the cooling power of the potential heat load. This may result in the need of a further heat transfer element to account for unexpected heat loads. In the fourth segment 94, a heat transfer element 342 covers the entire length of the segment 94. A further heat transfer element 344 is provided which only covers a small portion of the segment 94. This could be useful, for example, where it is known that localized cooling will occur at a particular part of a segment more frequently than at other parts, in use. The two heat transfer elements 342, 344 could be provided at different locations within the substrate table. The position of the heat transfer elements in FIG. 17 could be the same as the position of the heating element 250. That is, they could be positioned below the first drain 10 or on either side of it, or elsewhere. In the case of two overlapping heat transfer elements such as in the fourth segment 94 of FIG. 17, one heat transfer element could be provided to the right hand side of the chamber 140 and the other heat transfer element could be provided below the first drain 10 or to the left hand side of the chamber 140.

In FIG. 17 the fifth segment 95 has a single heat transfer element 350 which does not extend along the whole length of the segment 95. In the sixth segment 96, two heat transfer elements 360 are present which, contrary to what is the case in the third segment 93, do extend along the entire length of the segment 96.

As can be seen, the heat transfer elements, as a group, extend substantially around the edge of the substrate supporting area, even though there may be gaps between neighboring heat transfer elements. At least two heat transfer elements may be non-parallel and this helps ensure that not just portions on opposite sides of the edge of the substrate supporting area have associated heat transfer elements (as in, for example, the arrangement of parallel heaters in U.S. Pat. No. 7,304,715).

Each of the heat transfer elements are shaped closely to conform, in plan, to the portion of the edge of the substrate supporting area with which they are associated, that is, the heat transfer elements are not, in plan, straight, they are curved. Each of the heat transfer elements may be elongate in the vertical or horizontal direction as well as elongate peripherally as illustrated in FIG. 17. Any combination of horizontal and vertical heat transfer element and/or number of heat transfer element(s) and/or location may be used in each segment.

In an embodiment, the plurality of heat transfer elements are individually controllable in the sense that at least two of the plurality of heat transfer elements are independently controllable of one another. However, it may be the case that two heat transfer elements in the same segment are controlled in unison. For example, in the third and sixth segments 93, 96 of FIG. 17, the heat transfer elements 330, 360 may be controlled in the same way.

In an embodiment, the control of the heat transfer elements is done based on results of temperature sensors positioned within the segment. As can be seen in FIG. 17, each segment may be provided with a single sensor 410 as is illustrated in the first segment 91. Alternatively or additionally, more than one temperature sensor may be provided per segment. One such example is illustrated in the second segment 92 where there are three temperature sensors 420 positioned along the length of the segment 92.

By providing the plurality of heat transfer elements which are individually controllable, it is possible to account for local heat variations which are likely when a localized area liquid supply system is used. That is, if the inlet 110 passes under a localized liquid supply system, cooling is only likely to occur along a length of the inlet 110 which passes under the area covered by liquid. With the system of FIG. 17 it is possible to heat only that area and so maintain a more constant temperature of the substrate table WT and thereby reduce overlay errors. By providing the heat transfer elements in groups of segments, it is possible carefully to control the local temperature.

A controller may be provided to control the power applied to each of the heat transfer elements. The controller may base the amount of power supplied to each heat transfer element 310, 322, 324, 330, 342, 344, 350, 360 on signals received from one or more temperature sensors. Alternatively or additionally, power may be applied to the heat transfer elements based on the position of the substrate table WT under the liquid handling system. Therefore when the position of the substrate table WT indicates that a heat load may be applied due to the first drain 10 being at a certain location, a heat transfer element at that location may be energized to compensate. The controller may be in the form of computer software. The controller may control a plurality of heat transfer elements of a single segment as a group or it may control those heat transfer elements individually.

Splitting the heat transfer elements up into at least three segments around the inlet 110, desirably at least four or at least six different segments, may be advantageous. The ideal number of segments is linked to the width (e.g., diameter) of the localized area of the top surface of the substrate table and/or substrate to which the liquid supply system provides liquid. If each segment has a length of three times or less than the width (e.g., diameter) of the localized area, significant improvements in temperature regulation may be achieved.

If the inlet 110 is connected to the under pressure via a plurality of distinct through holes positioned along the periphery of the inlet 110, then the number of segments in which the heat transfer elements are distributed may be an integer multiple of the number of the distinct through holes. For example, if there are 3 distinct through holes then the number of segments may be 3, or 6, or 9, or 12, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Although the invention has been described in detail for the purpose of illustration, it is to be understood that such detail is solely for that purpose and that the invention is not limited to the disclosed embodiments, but, on the contrary, is intended to cover modifications and equivalent arrangements that are within the spirit and scope of the appended claims. In addition, it is to be understood that the invention contemplates that, to the extent possible, one or more features of any embodiment can be combined with one or more features of any other embodiment.

The invention claimed is:

1. A lithographic apparatus comprising:
a heat transfer assembly configured to temperature control at least a portion of the lithographic apparatus, the heat transfer assembly comprising:
a printed circuit board configured to be attached to the portion of the lithographic apparatus, and
a plurality of heat transfer elements configured to be attached to the portion of the lithographic apparatus, the plurality of heat transfer elements being separate from and electrically coupled to the printed circuit board,
wherein the printed circuit board comprises first engaging members that are configured to engage with second engaging members of the plurality of heat transfer elements to connect the plurality of heat transfer elements with the printed circuit board.

2. The lithographic apparatus of claim 1, wherein the portion of the lithographic apparatus is a substrate table.

3. The lithographic apparatus of claim 1, wherein the plurality of heat transfer elements are connected to the printed circuit board by a soldering process.

4. The lithographic apparatus of claim 2, wherein the plurality of heat transfer elements are positioned to extend substantially around an edge of a substrate supporting area of the substrate table.

5. The lithographic apparatus of claim 4, wherein at least one of the plurality of heat transfer elements, may include an arc-shaped configuration that extends substantially around the edge of the substrate supporting area of the substrate table.

6. The lithographic apparatus of claim 4, wherein at least one of the plurality of heat transfer elements, when electrically coupled to the printed circuit board, is moveable separately from the printed circuit board so as to align the at least one of the plurality of heat transfer elements around the edge of the substrate supporting area separately from the printed circuit board.

7. The lithographic apparatus of claim 4, wherein the printed circuit board is attached on a surface opposite the substrate supporting area.

8. The lithographic apparatus of claim 1, wherein at least one of the plurality of heat transfer elements is releasably connected to the printed circuit board.

9. The lithographic apparatus of claim 1, wherein the heat transfer assembly is configured to heat the portion of the lithographic apparatus.

10. A method of assembling a heat transfer assembly, the method comprising:
providing a plurality of heat transfer elements that are separate from a printed circuit board, wherein the printed circuit board is configured to be attached to at least a portion of an apparatus, the plurality of heat transfer elements are configured to be attached to the portion of the apparatus, and the printed circuit board comprises first engaging members that are configured to engage with second engaging members of the plurality of heat transfer elements to connect the plurality of heat transfer elements with the printed circuit board; and
interconnecting at least a portion of the plurality of heat transfer elements with at least a portion of the printed circuit board.

11. The method of claim 10, wherein the interconnecting comprises using soldering process to connect the plurality of heat transfer elements to the printed circuit board.

12. The method of claim 10, wherein at least one of the plurality of heat transfer elements is releasably connected to the printed circuit board.

13. The method of claim 10, further comprising moving at least one of the plurality of heat transfer elements, when connected to the printed circuit board, separately from the printed circuit board so as to align the at least one of the plurality of heat transfer elements on the portion of the apparatus separately from the printed circuit board.

14. A heat transfer assembly comprising:
a printed circuit board configured to be attached to at least a portion of an apparatus; and
a plurality of heat transfer elements configured to be attached to the portion of the apparatus, wherein the plurality of heat transfer elements are separate from and are electrically coupled to the printed circuit board and the plurality of heat transfer elements extend laterally, at least in part, from a periphery of the printed circuit board.

15. The heat transfer assembly of claim 14, wherein the plurality of heat transfer elements are connected to the printed circuit board by a soldering process.

16. The heat transfer assembly of claim 14, wherein at least one of the plurality of heat transfer elements is releasably connected to the printed circuit board.

17. The heat transfer assembly of claim 14, wherein the printed circuit board comprises first engaging members that are configured to engage with second engaging members of the plurality of heat transfer elements to connect the plurality of heat transfer elements with the printed circuit board.

18. The heat transfer assembly of claim 14, wherein at least one of the plurality of heat transfer elements, when electrically coupled to the printed circuit board, is moveable separately from the printed circuit board so as to align the at least one of the plurality of heat transfer elements on the portion of the apparatus separately from the printed circuit board.

19. The heat transfer assembly of claim 14, configured to heat the portion of the apparatus.

20. A method of assembling a heat transfer assembly, the method comprising:
providing a plurality of heat transfer elements that are separate from a printed circuit board, wherein the printed circuit board is configured to be attached to at least a portion of an apparatus and the plurality of heat transfer elements are configured to be attached to the portion of the apparatus; and
interconnecting at least a portion of the plurality of heat transfer elements with at least a portion of the printed circuit board such that the plurality of heat transfer elements extend laterally, at least in part, from a periphery of the printed circuit board.

21. The method of claim 20, further comprising moving at least one of the plurality of heat transfer elements, when connected to the printed circuit board, separately from the printed circuit board so as to align the at least one of the plurality of heat transfer elements on the portion of the apparatus separately from the printed circuit board.

* * * * *